United States Patent
Chen

(10) Patent No.: US 11,081,033 B2
(45) Date of Patent: Aug. 3, 2021

(54) SHIFT REGISTER UNIT AND DRIVING METHOD THEREOF, GATE DRIVER, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Xiaohai Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/640,296

(22) PCT Filed: May 21, 2019

(86) PCT No.: PCT/CN2019/087801
§ 371 (c)(1),
(2) Date: Feb. 19, 2020

(87) PCT Pub. No.: WO2019/223686
PCT Pub. Date: Nov. 28, 2019

(65) Prior Publication Data
US 2021/0082329 A1  Mar. 18, 2021

(30) Foreign Application Priority Data
May 23, 2018 (CN) .......................... 201810504947.4

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2300/0426* (2013.01);
(Continued)

(58) Field of Classification Search
CPC ................................. G09G 2/20; G11C 19/28
(Continued)

(56) References Cited

U.S. PATENT DOCUMENTS 9,396,691 B2  7/2016 Zeng
2002/0000961 A1* 1/2002 Kang .................. G09G 3/3648
345/87

(Continued)

FOREIGN PATENT DOCUMENTS

CN   104240631 A   12/2014
CN   104282287 A   1/2015
(Continued)

OTHER PUBLICATIONS

Chinese Office Action corresponding to CN 201810504947.4, dated Dec. 4, 2019 (9 pages, including English Translation).

*Primary Examiner* — Calvin C Ma
(74) *Attorney, Agent, or Firm* — Myers Bigel, P.A.

(57) ABSTRACT

A shift register unit includes: an input terminal, a first voltage terminal, a second voltage terminal, a first clock terminal, a second clock terminal and an output terminal, as well as an input circuit, a control circuit and an output circuit. In addition, a method for driving the shift register unit, a gate driver composed of the shift register units, a display panel comprising the gate driver and a display device comprising the display panel are also disclosed.

20 Claims, 6 Drawing Sheets

(52) U.S. Cl.
CPC ............... *G09G 2300/0809* (2013.01); *G09G 2310/0286* (2013.01); *G09G 2310/08* (2013.01)

(58) Field of Classification Search
USPC .................................................. 345/212, 690
See application file for complete search history.

(56) References Cited

U.S. PATENT DOCUMENTS

| | | |
|---|---|---|
| 2016/0125847 A1 | 5/2016 | Gu |
| 2016/0217870 A1 | 7/2016 | Tseng et al. |
| 2016/0259455 A1 | 9/2016 | Li et al. |
| 2017/0160607 A1 | 6/2017 | Zhao et al. |
| 2017/0162148 A1 | 6/2017 | Xiao et al. |
| 2019/0012976 A1* | 1/2019 | Chen .................... G09G 3/3677 |

FOREIGN PATENT DOCUMENTS

| | | |
|---|---|---|
| CN | 105243984 A | 1/2016 |
| CN | 105895011 A | 8/2016 |
| CN | 106782338 A | 5/2017 |
| CN | 108766335 A | 11/2018 |
| KR | 20070002713 A | 1/2007 |
| WO | 2017/049659 A1 | 3/2017 |

\* cited by examiner

SHIFT REGISTER UNIT AND DRIVING METHOD THEREOF, GATE DRIVER, DISPLAY PANEL AND DISPLAY DEVICE

CROSS REFERENCE TO RELATED APPLICATIONS

The present application is a 35 U.S.C. 371 national stage application of PCT International Application No. PCT/CN2019/087801, filed on May 21, 2019, which claims the benefit of Chinese Patent Application No. 201810504947.4, filed on May 23, 2018, the entire disclosures of which are incorporated herein by reference.

TECHNICAL FIELD

The present disclosure relates to the generation of a gate drive signal, and particularly to a shift register unit and a driving method thereof, a gate driver comprising the shift register unit, a display panel comprising the gate driver and a display device.

BACKGROUND

In recent years, the development of display devices has demonstrated a high-integration and low-cost trend. One of these technologies is a gate driver using a GOA (Gate Driver on Array). Integrating gate switch circuits on the array substrate of a display panel by means of the GOA technology makes it possible to omit a gate drive integrated circuit part, thereby reducing costs in terms of materials and manufacturing processes. As a result, the display panel can have an aesthetic design with symmetrical sides and narrow rims.

Such a gate driver using the GOA comprises a plurality of cascaded shift register units to generate gate drive signals so as to provide the gate drive signals to the pixel array of the display panel. However, most of the existing gate drivers using the GOA experience current leaking in their internal circuits, so the stability of their gate drive signals needs to be improved.

SUMMARY

According to one aspect of the present disclosure, there is provided a shift register unit, comprising: an input terminal configured to receive an input pulse; a first voltage terminal configured to be applied with a first voltage; a second voltage terminal configured to be applied with a second voltage; a first clock terminal configured to receive a first clock signal; a second clock terminal configured to receive a second clock signal; an output terminal configured to output an output signal; an input circuit configured to: in response to the first clock signal received at the first clock terminal being active, bring the second voltage terminal into conduction with a first node, and bring the input terminal into conduction with a second node; a control circuit configured to: in response to the second clock signal received at the second clock terminal being active and the potential of the second node being at an active potential, make the potential of the first node at an inactive potential; and an output circuit configured to: in response to the potential of the first node being at an active potential, bring the first voltage terminal into conduction with the output terminal, and in response to the potential of the second node being at an active potential, bring the second clock terminal into conduction with the output terminal.

According to some exemplary embodiments, the input circuit comprises: a first transistor having a control electrode connected to the first clock terminal, a first electrode connected to the first node, and a second electrode connected to the second voltage terminal; and a second transistor having a control electrode connected to the first clock terminal, a first electrode connected to the input terminal, and a second electrode connected to the second node.

According to some exemplary embodiments, the output circuit comprises: a third transistor having a control electrode connected to the first node, a first electrode connected to the output terminal, and a second electrode connected to the first voltage terminal; and a fourth transistor having a control electrode connected to the second node, a first electrode connected to the second clock terminal, and a second electrode connected to the output terminal.

According to some exemplary embodiments, the output circuit further comprises: a first capacitor having a first electrode connected to the second electrode of the fourth transistor, and a second electrode connected to the control electrode of the fourth transistor.

According to some exemplary embodiments, the output circuit further comprises a second capacitor having a first electrode connected to the second electrode of the third transistor, and a second electrode connected to the control electrode of the third transistor.

According to some exemplary embodiments, the control circuit comprises: a fifth transistor having a control electrode connected to the second clock terminal, and a first electrode connected to the first node; a sixth transistor having a control electrode connected to the second node, and a second electrode connected to the first voltage terminal; and the second electrode of the fifth transistor being connected to the first electrode of the sixth transistor.

According to some exemplary embodiments, the control circuit comprises: a fifth transistor having a control electrode connected to the second clock terminal, and a first electrode connected to the first node; a sixth transistor having a control electrode connected to the second node, and a second electrode connected to the first clock terminal; and the second electrode of the fifth transistor being connected to the first electrode of the sixth transistor.

According to some exemplary embodiments, the control circuit further comprises: a seventh transistor having a control electrode connected to the first node, and a second electrode connected to the first voltage terminal; an eighth transistor having a control electrode connected to the second clock terminal, and a first electrode connected to the second node; and the first electrode of the seventh transistor being connected to the second electrode of the eighth transistor.

According to another aspect of the present disclosure, there is provided a gate driver comprising N cascaded above-mentioned shift register units, wherein N is an integer greater than or equal to 2, wherein the output terminal of the m-th shift register unit of the N shift register units is connected to the input terminal of the (m+1)-th shift register unit of the N shift register units, wherein m is an integer and $1 \le m < N$.

According to a further aspect of the present disclosure, there is provided a display panel comprising: a first voltage line configured to transmit a first voltage line voltage; a second voltage line configured to transmit a second voltage line voltage; a first clock line configured to transmit a first clock line clock signal; a second clock line configured to transmit a second clock line clock signal; and the above-mentioned gate driver, wherein the first voltage terminal of each of the N shift register units is connected to the first voltage line, the second voltage terminal of each of the N shift register units is connected to the second voltage line, the first clock terminal of the (2k−1)-th shift register unit of the N shift register units is connected to the first clock line, and the second clock terminal thereof is connected to the second clock line, and the first clock terminal of the 2k-th shift register unit of the N shift register units is connected to the second clock line, and the second clock terminal thereof is connected to the first clock line, and wherein k is a positive integer and According to a further aspect of the present disclosure, there is provided a display device comprising: the abovementioned display panel; a timing controller configured to control the operation of the display panel, wherein the timing controller is configured to at least provide the first clock line and the second clock line respectively with the first clock line clock signal and the second clock line clock signal, wherein the first clock line clock signal and the second clock line clock signal have the same period and duty cycle, and are different from each other in time sequence by half a period; a voltage generator configured to at least provide the first voltage line and the second voltage line respectively with the first voltage line voltage and the second voltage line voltage, wherein the first voltage line voltage is at an inactive voltage level and the second voltage line voltage is at an active voltage level.

According to some exemplary embodiments, the first clock line clock signal and the second clock line clock signal each have a 50% duty cycle.

According to a yet another aspect of the present disclosure, there is provided a method for driving the abovementioned shift register unit, comprising: providing the first voltage to the first voltage terminal, and providing the second voltage to the second voltage terminal, wherein the first voltage is at an inactive voltage level and the second voltage is at an active voltage level; providing the first clock signal to the first clock terminal, and providing the second clock signal to the second clock terminal, wherein the first clock signal and the second clock signal have the same period and duty cycle, and are different from each other in time sequence by half a period; and providing the input pulse to the input terminal, the pulse width of the input pulse being synchronized with the duration when the first clock signal is active.

According to some exemplary embodiments, the first clock signal and the second clock signal each have a duty cycle of 50%.

BRIEF DESCRIPTION OF DRAWINGS

The exemplary specific embodiments of the present disclosure will be described in detail with reference to the drawings hereinafter, so as to have a more comprehensive appreciation and understanding of the problem to be solved by the present disclosure, as well as the above and other objectives, features and advantages, wherein.

Throughout the drawings, identical or similar parts, components and/or elements are denoted by the same reference numerals.

DETAILED DESCRIPTION

Figure 1:
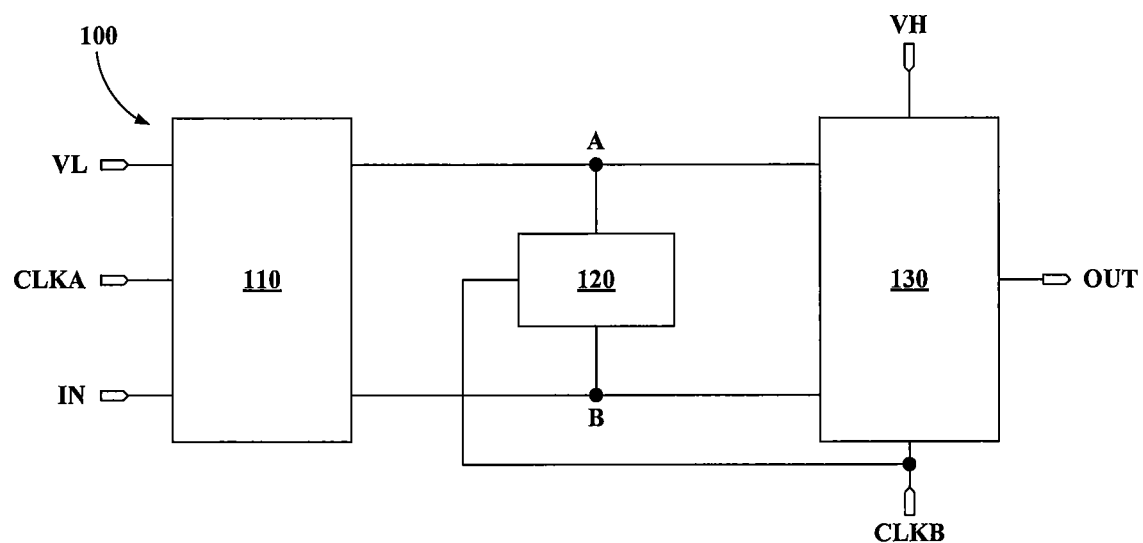
FIG. 1 shows a structural schematic view of a shift register unit according to an exemplary embodiment of the present disclosure.

It will be understood that although terms such as "first", "second" and "third" etc. may be used herein to describe various elements, components and/or parts, these elements, components and/or parts should not be restricted by these terms. These terms are only used to distinguish one element, component or part from another. Therefore, the first element, component or part discussed below may also be referred to as the second or third element, component or part without departing from the teachings of the present disclosure.

The terms used herein are only used for the purpose of describing a particular embodiment, rather than limiting the present disclosure. As used herein, the singular forms of "a", "an" and "the" are also intended to include the plural forms, unless otherwise specified clearly in the context. It shall also be understood that the terms such as "comprise" and/or "include", when used in the specification of the present disclosure, indicate the presence of the features, entireties, steps, operations, elements and/or components, but do not exclude the presence of one or more other features, entireties, steps, operations, elements, components and/or groups thereof, or the addition of one or more other features, entireties, steps, operations, elements, components and/or groups thereof. Moreover, the term "and/or" used herein comprises any and all combinations of one or more of the related items as listed.

It shall be understood that when an element is described as "connected to another element" or "coupled to another element", it may be directly connected to another element or directly coupled to another element, or there may be an intermediate element. To the contrary, when an element is described as "directly connected to another element" or "directly coupled to another element", there is no intermediate element.

Unless otherwise defined, all terms (including technical terms and scientific terms) used herein have the same meaning as commonly understood by one having ordinary skills in the art, to which the present disclosure belongs. It should also be understood that terms such as those defined in a common dictionary should be construed as having the same meaning as in the related art and/or in the context of the present specification, and will not be construed in an ideal or overly formal sense, unless defined explicitly as such herein.

It should also be explained that, in the description of the specification of the present application, expressions such as "an embodiment", "some embodiments", "exemplary embodiments", "specific examples" or "some examples" are intended to mean that specific features, structures, materials or characteristics described with reference to the embodiments or examples are contained in at least one embodiment or example of this disclosure. Therefore, schematic descriptions with respect to the above expressions herein do not have to be only directed at the same embodiments or examples herein. Instead, specific features, structures, materials or characteristics described thereby can be combined in a suitable manner in any one or more embodiments or examples. Besides, where no contradiction is caused, one skilled in the art can combine and assemble different embodiments or examples described in the specification and features of different embodiments or examples.

Some techniques, structures and materials commonly known in the art of this disclosure are not described in detail for the sake of clarity so as to avoid making the present application tediously long.

With reference to FIG. 1, it shows a structural schematic view of a shift register unit 100 according to the present disclosure. The shift register unit 100 comprises: an input terminal IN configured to receive an input pulse; a first voltage terminal VH configured to be applied with a first voltage; a second voltage terminal VL configured to be applied with a second voltage; a first clock terminal CLKA configured to receive a first clock signal; a second clock terminal CLKB configured to receive a second clock signal; and an output terminal OUT configured to output an output signal. The shift register unit 100 further comprises an input circuit 110, a control circuit 120 and an output circuit 130, which are illustrated as blocks.

The input circuit 110 is configured to: in response to the first clock signal received at the first clock terminal CLKA being active, bring the second voltage terminal VL into conduction with a first node A, and bring the input terminal IN into conduction with a second node B.

The control circuit 120 is configured to: in response to the second clock signal received at the second clock terminal CLKB being active and the potential of the second node B being at an active potential, make the potential of the first node A at an inactive potential.

The output circuit 130 is configured to: in response to the potential of the first node A being at an active potential, bring the first voltage terminal VH into conduction with the output terminal OUT, and in response to the potential of the second node B being at an active potential, bring the second clock terminal CLKB into conduction with the output terminal OUT.

The term "active potential" as used herein refers to a potential at which the circuit element(s) (e.g., a transistor) involved is/are enabled, and the term "inactive potential" as used herein refers to a potential at which the circuit element(s) (e.g., a transistor) involved is/are disenabled. As for an n-type transistor, an active potential is a high potential, and an inactive potential is a low potential. As for a p-type transistor, an active potential is a low potential, and an inactive potential is a high potential. It shall be understood that an active potential or an inactive potential does not intend to indicate a specific potential, but may comprise a potential range. In addition, the terms "potential level" and "potential" may be used interchangeably.

Figure 2:
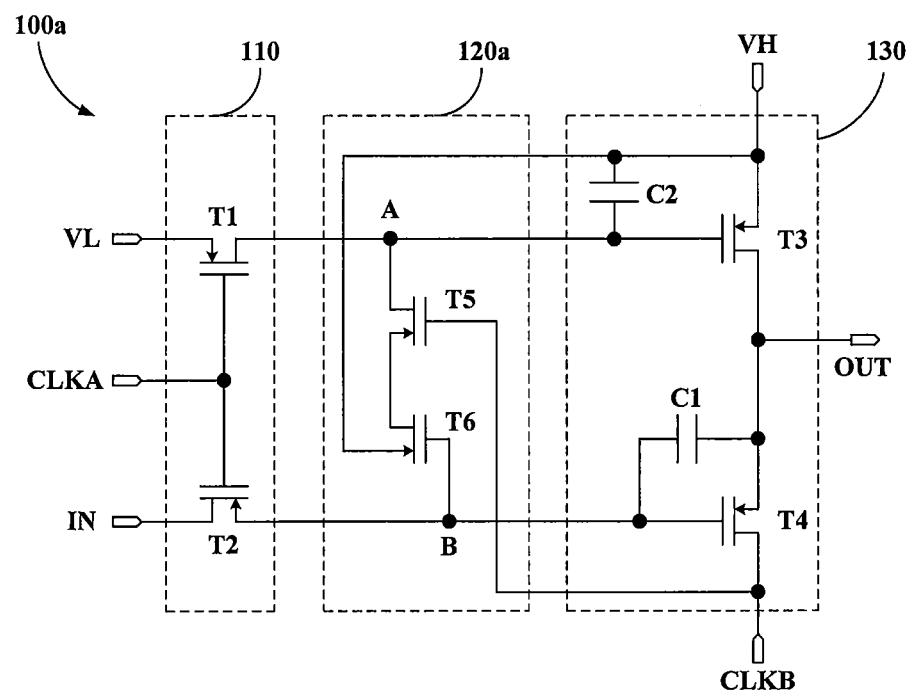
FIG. 2 shows a circuit diagram of a first exemplary circuit of the shift register unit as shown in FIG. 1 according to an exemplary embodiment of the present disclosure.

FIG. 2 shows a circuit diagram of a first exemplary circuit 100a of the shift register unit 100 as shown in FIG. 1 according to an exemplary embodiment of the present disclosure. The exemplary configuration of the first exemplary circuit 100a of the shift register unit 100 will be described with reference to FIG. 2.

It should be noted that the transistor used in the exemplary embodiments of the present disclosure may be a thin-film transistor or field effect transistor or other device having the same characteristics. In each exemplary embodiment, each transistor is typically made so that the source and drain thereof may be used interchangeably. Thus, there is no substantial difference in the description of the connection relationship between the source and the drain thereof. In various exemplary embodiments of the present disclosure, in order to distinguish the source and the drain of a transistor, one of the electrodes is referred to as a first electrode, the other is referred to as a second electrode, and the gate is referred to as a control electrode. In the exemplary embodiment of the present disclosure, although each transistor is illustrated and described as a p-type transistor, an n-type transistor is also possible. In the case of an n-type transistor, a gate-on voltage has a high potential and a gate-off voltage has a low potential. In the following exemplary embodiments of the present disclosure, as an example, the source of the transistor is used as a first electrode, the drain thereof is used as a second electrode, and the gate thereof is used as a control electrode. It is easy to understand that one skilled in the art may, under the teachings of the present disclosure, use an n-type transistor to replace one or more p-type transistors in the various exemplary embodiments of the present disclosure, or may add or remove one or more elements in the various exemplary embodiments of the present disclosure, without departing from the spirit and scope of the present disclosure. In addition, other embodiments may also be contemplated without contradicting the teachings of the present disclosure.

As shown in FIG. 2, the input circuit 110 comprises a first transistor T1 and a second transistor T2. The first transistor T1 has a control electrode connected to the first clock terminal CLKA, a first electrode connected to the first node A, and a second electrode connected to the second voltage terminal VL. The second transistor T2 has a control electrode also connected to the first clock terminal CLKA, a first electrode connected to the input terminal IN, and a second electrode connected to the second node B. Thus, in response to the first clock signal received at the first clock terminal CLKA being active, the second voltage terminal VL is brought into conduction with the first node A, and the input terminal IN is brought into conduction with the second node B.

The output circuit 130 comprises a third transistor T3 and a fourth transistor T4. The third transistor T3 has a control electrode connected to the first node A, a first electrode connected to the output terminal OUT, and a second electrode connected to the first voltage terminal VH. The fourth transistor T4 has a control electrode connected to the second node B, a first electrode connected to the second clock terminal CLKB, and a second electrode connected to the output terminal OUT. Thus, in response to the potential of the first node A being at an active potential, the first voltage terminal VH is brought into conduction with the output terminal OUT, and in response to the potential of the second node B being at an active potential, the second clock terminal CLKB is brought into conduction with the output terminal OUT. The output circuit 130 further comprises a first capacitor C1 having a first electrode connected to the second electrode of the fourth transistor T4, and a second electrode connected to the control electrode of the fourth transistor T4. The existence of the first capacitor C1 is advantageous. When the output signal of the output terminal OUT changes from a high potential to a low potential, the potential at the second node B can be further lowered by means of the first capacitor C1, so that the fourth transistor T4 is further turned on, as will be described later. Optionally, the output circuit 130 also may not comprise the first capacitor C1. Furthermore, the output circuit 130 further comprises a second capacitor C2 having a first electrode connected to the second electrode of the third transistor T3, and a second electrode connected to the control electrode of the third transistor T3. The existence of the second capacitor C2 may also be advantageous because it may further stabilize the potential at the first node A. Optionally, the output circuit 130 also may not comprise the second capacitor C2.

The first control circuit 120a comprises a fifth transistor T5 and a sixth transistor T6. The fifth transistor T5 has a control electrode connected to the second clock terminal CLKB, and a first electrode connected to the first node A; the sixth transistor T6 has a control electrode connected to the second node B, and a second electrode connected to the first voltage terminal VH; and the second electrode of the fifth transistor T5 is connected to the first electrode of the sixth transistor T6. Thus, in response to the second clock signal received at the second clock terminal CLKB being active and the potential of the second node B being at an active potential, the fifth transistor T5 and the sixth transistor T6 are turned on to bring the first voltage terminal VH into conduction with the first node A, thereby making the potential of the first node A at an inactive potential.

Figure 3:
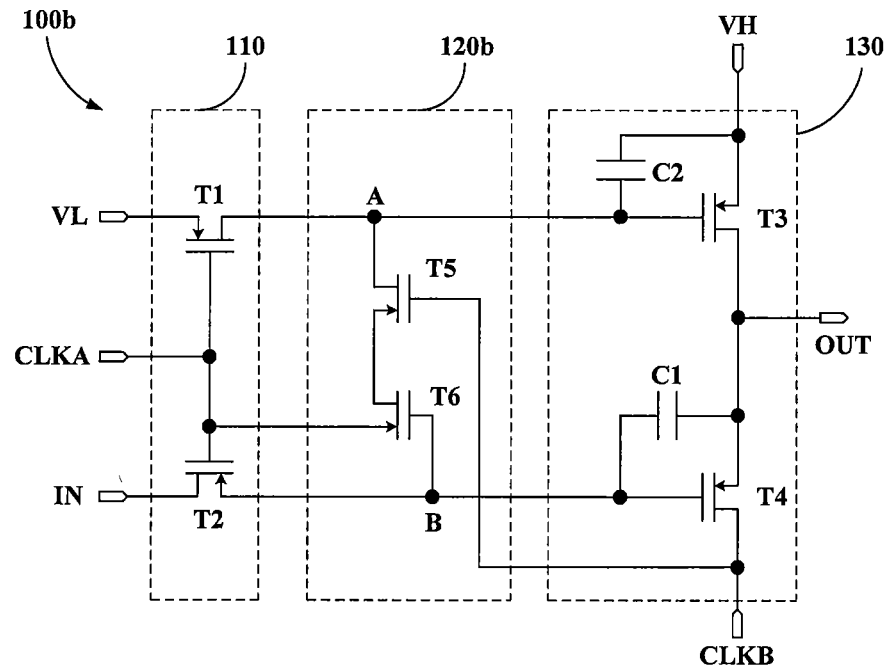
FIG. 3 shows a circuit diagram of a second exemplary circuit of the shift register unit as shown in FIG. 1 according to an exemplary embodiment of the present disclosure.

FIG. 3 shows a circuit diagram of a second exemplary circuit 100b of the shift register unit 100 as shown in FIG. 1 according to an exemplary embodiment of the present disclosure. The second exemplary circuit 100b as shown in FIG. 3 differs from the first exemplary circuit 100a as shown in FIG. 2 only in that the second exemplary circuit 100b has a different second control circuit 120b. Therefore, only the second control circuit 120b will be described hereinafter.

The second control circuit 120b also comprises a fifth transistor T5 and a sixth transistor T6. The fifth transistor T5 has a control electrode connected to the second clock terminal CLKB, and a first electrode connected to the first node A; the sixth transistor T6 has a control electrode connected to the second node B, and a second electrode connected to the first clock terminal CLKA; and the second electrode of the fifth transistor T5 is connected to the first electrode of the sixth transistor T6. Thus, in response to the second clock signal received at the second clock terminal CLKB being active and the potential of the second node B being at an active potential, the fifth transistor T5 and the sixth transistor T6 are turned on to bring the first node A into conduction with the first clock terminal CLKA. When the second clock signal received at the second clock terminal CLKB is active, the first clock signal received at the first clock terminal CLKA is inactive, thereby making the potential of the first node A at an inactive potential.

Figure 4:
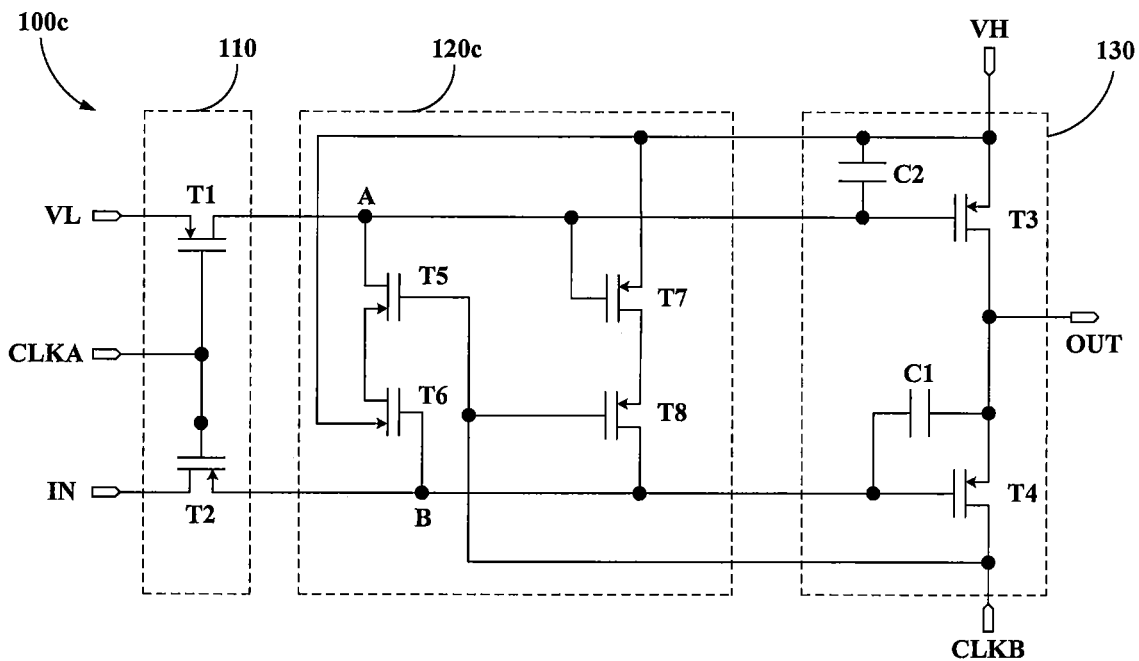
FIG. 4 shows a circuit diagram of a third exemplary circuit of the shift register unit as shown in FIG. 1 according to an exemplary embodiment of the present disclosure.

FIG. 4 shows a circuit diagram of a third exemplary circuit 100c of the shift register unit 100 as shown in FIG. 1 according to an exemplary embodiment of the present disclosure. The third exemplary circuit 100c as shown in FIG. 4 differs from the first exemplary circuit 100a and the second exemplary circuit 100b as described above only in that the third exemplary circuit 100c has a different third control circuit 120c. Therefore, only the third control circuit 120c will be described hereinafter.

The third control circuit 120c comprises a fifth transistor T5, a sixth transistor T6, a seventh transistor T7 and an eighth transistor T8. The fifth transistor T5 has a control electrode connected to the second clock terminal CLKB, and a first electrode connected to the first node A; the sixth transistor T6 has a control electrode connected to the second node B, and a second electrode connected to the first voltage terminal VH; and the second electrode of the fifth transistor T5 is connected to the first electrode of the sixth transistor T6. The seventh transistor T7 has a control electrode connected to the first node A, and a second electrode connected to the first voltage terminal VH; the eighth transistor T8 has a control electrode connected to the second clock terminal CLKB, and a first electrode connected to the second node B; and the first electrode of the seventh transistor T7 is connected to the second electrode of the eighth transistor T8. The fifth transistor T5 and the sixth transistor T6 perform the same function in the third control circuit 120c as they do in the first control circuit 120a; i.e., in response to the second clock signal received at the second clock terminal CLKB being active and the potential of the second node B being at an active potential, the fifth transistor T5 and the sixth transistor T6 are turned on to make the potential of the first node A at an inactive potential. However, the seventh transistor T7 and the eight transistor T8 are used as follows: in response to the second clock signal received at the second clock terminal CLKB being active and the first node A being at an active potential, the seventh transistor T7 and the eighth transistor T8 are turned on to bring the first voltage terminal VH into conduction with the second node B so as to charge the second node B, thereby keeping the second node B at an inactive potential.

Figure 5:
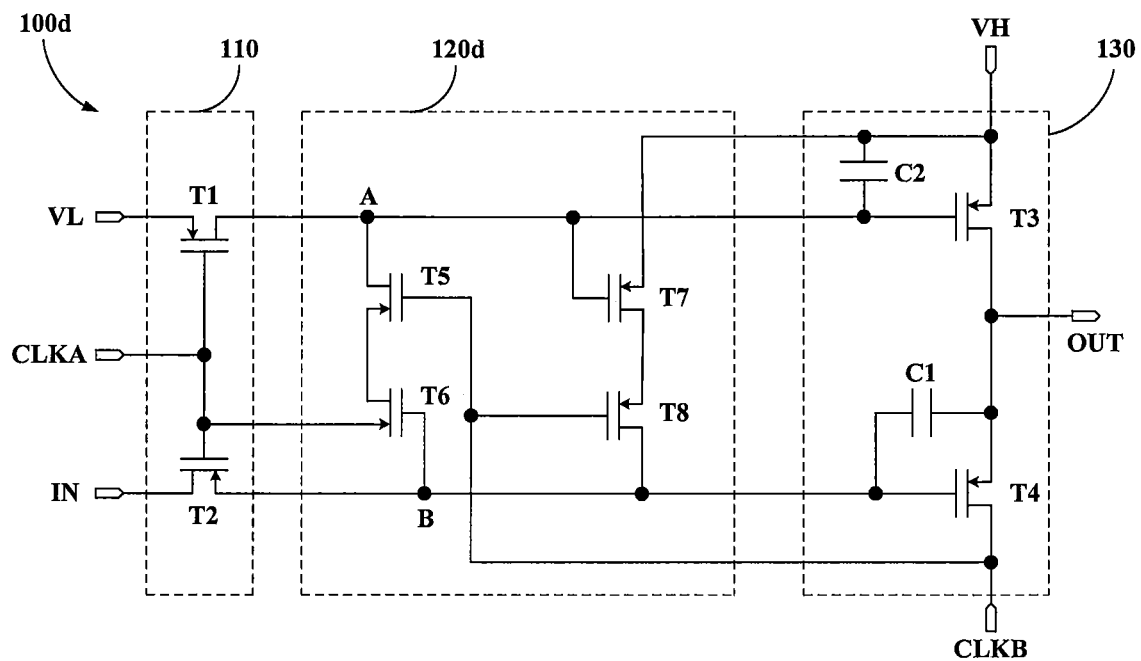
FIG. 5 shows a circuit diagram of a fourth exemplary circuit of the shift register unit as shown in FIG. 1 according to an exemplary embodiment of the present disclosure.

FIG. 5 shows a circuit diagram of a fourth exemplary circuit 100d of the shift register unit 100 as shown in FIG. 1 according to an exemplary embodiment of the present disclosure. The fourth exemplary circuit 100d as shown in FIG. 5 differs from the third exemplary circuit 100c as described above only in that the fourth control circuit 120d of the fourth exemplary circuit 100d is slightly different. Therefore, only the fourth control circuit 120d will be described hereinafter.

The fourth control circuit 120d also comprises the fifth transistor T5, the sixth transistor T6, the seventh transistor T7 and the eighth transistor T8. The connections of the fifth transistor T5, the seventh transistor T7 and the eighth transistor T8 are the same as those in the third control circuit 120c, with the only difference that the second electrode of the sixth transistor T6 is now connected to the first clock terminal CLKA. It can be easily understood that the fifth transistor T5 and the sixth transistor T6 perform the same function in the fourth control circuit 120d as they do in the second control circuit 120b. In addition, the seventh transistor T7 and the eight transistor T8 perform the same function in the fourth control circuit 120d as they do in the third control circuit 120c, which will not be reiterated.

Figure 6:
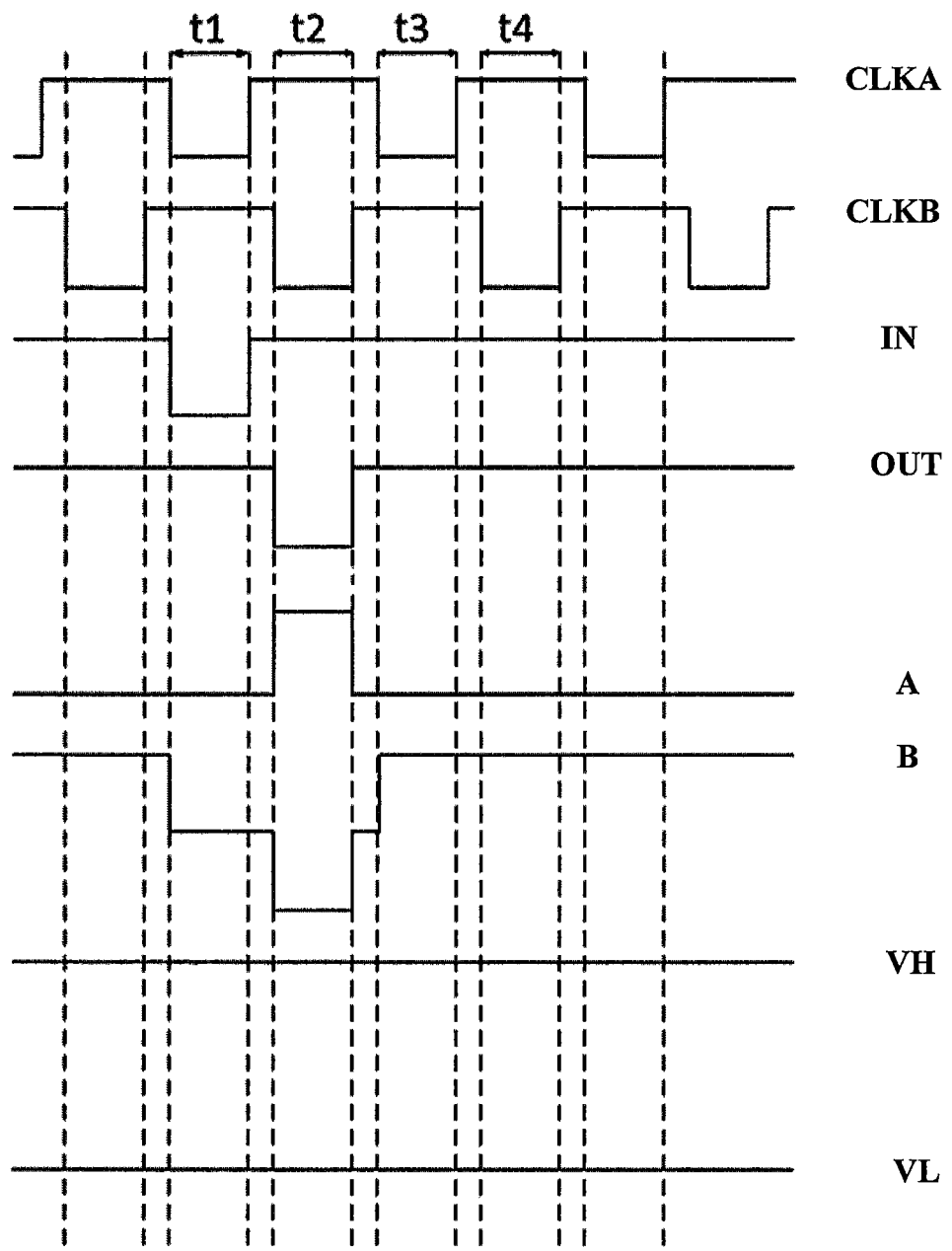
FIG. 6 is a timing sequence diagram for the exemplary circuits of the shift register units as shown in FIGS. 2-5.

With reference to FIG. 6, it is an exemplary timing sequence diagram for the exemplary circuit of the shift register unit as shown in FIGS. 2-5. As shown in FIG. 6, the first clock signal received from the first clock terminal CLKA and the second clock signal received from the second clock terminal CLKB have the same period and duty cycle, and the first clock signal and the second clock signal are different from each other in time sequence by half a period; and the pulse width of the input pulse received at the input terminal IN is synchronized with the duration when the first clock signal is inactive. In addition, the first voltage terminal VH is applied with a high voltage level, and the second voltage terminal VL is applied with a low voltage level.

The operation of the exemplary circuits as shown in FIGS. 2-5 will be specifically described with reference to FIG. 6. Hereinafter, a high potential is denoted by 1 and a low potential is denoted by 0.

In the first time phase t1, IN=0, VH=1, VL=0, CLKA=0, and CLKB=1. Since CLKA=0, the first transistor T1 and the second transistor T2 are turned on, thereby correspondingly bringing the second voltage terminal VL into conduction with the first node A, and bringing the input terminal IN into conduction with the second node B, thereby making both the first node A and the second node B at a low potential (i.e., at an active potential). Then, since the first node A is at a low potential, the third transistor T3 is turned on, and since the second node B is at a low potential, the fourth transistor T4 and the sixth transistor T6 are both turned on; and since CLKB=1, the fifth transistor T5 is turned off. Therefore, in the first time phase t1, the output terminal OUT=1.

It should be noted that in the first time phase t1, for the third and fourth exemplary circuits 100c and 100d, since the first node A is at a low potential, the seventh transistor T7 is turned on, and since CLKB=1, the eighth transistor T8 is turned off.

In the second time phase t2, IN=1, VH=1, VL=0, CLKA=1, CLKB=0. Since CLKA=1, the first transistor T1 and the second transistor T2 are turned off, thereby correspondingly disconnecting the second voltage terminal VL from the first node A, and disconnecting the input terminal IN the second node B. At this time, the potential of the second node B is kept at a low potential, so both the fourth transistor T4 and the sixth transistor T6 are turned on. But CLKB=0 at this time, so the fifth transistor T5 is turned on, such that the first node A is brought into conduction with the first voltage terminal VH, and the potential of the first node A becomes a high potential (that is, at an inactive potential), such that the third transistor T3 is turned off. Turning on the fourth transistor T4 brings the second clock terminal CLKB into conduction with the output terminal OUT. Therefore, in the second time phase t2, the output terminal OUT=0.

In the second time phase t2, when the potential of the output terminal OUT becomes a low potential, since the voltage between the two electrodes of the first capacitor C1 cannot be transiently changed, the voltage at the second node B will be further lowered, thereby making the fourth transistor T4 fully turned on.

It should be noted that in the second time phase t2, for the third and fourth exemplary circuits 100c and 100d, since the first node A is at a high potential, the seventh transistor T7 is turned off, and since CLKB=0, the eighth transistor T8 is turned on.

In the third time phase t3, IN=1, VH=1, VL=0, CLKA=0, and CLKB=1. Since CLKA=0, the first transistor T1 and the second transistor T2 are turned on, thereby correspondingly bringing the second voltage terminal VL into conduction with the first node A, and bringing the input terminal IN into conduction with the second node B, thereby making the first node A at a low potential and the second node B at a high potential. Since the first node A is at a low potential, the third transistor T3 is turned on, and since the second node B is at a high potential, both the fourth transistor T4 and the sixth transistor T6 are turned off. Since CLKB=1, the fifth transistor T5 is turned off. Therefore, in the third time phase t3, the output terminal OUT=1.

It should be noted that in the third time phase t3, for the third and fourth exemplary circuits 100c and 100d, since the first node A is at a low potential, the seventh transistor T7 is turned on, and since CLKB=1, the eighth transistor T8 is turned off.

In the fourth time phase t4, IN=1, VH=1, VL=0, CLKA=1, CLKB=0. Since CLKA=1, the first transistor T1 and the second transistor T2 are turned off, thereby correspondingly disconnecting the second voltage terminal VL from the first node A and disconnecting the input terminal IN from the second node B. At this time, the potential of the second node B is kept at a high potential, so both the fourth transistor T4 and the sixth transistor T6 are turned off. At this time, CLKB=0, so the fifth transistor T5 is turned on. Since the potential of the first node A is kept at a low potential, the third transistor T3 is turned on, so that the first voltage terminal VH is brought into conduction with the output terminal OUT. Therefore, in the fourth time phase t4, the output terminal OUT=0.

It should be noted that in the fourth time phase t4, for the third and fourth exemplary circuits 100c and 100d, since the first node A is at a low potential, the seventh transistor T7 is turned on, and meanwhile, since CLKB=0, the eighth transistor T8 is also turned on, such that the first voltage terminal VH is brought into conduction with the second node B so as to charge the second node B, thereby ensuring that the second node B is kept at a high potential more stably during this time phase.

No matter how CLKA and CLKB change thereafter, the output signal of the output terminal OUT is at a high potential until the input terminal IN receives an input pulse again. When the input terminal IN receives an input pulse again, the shift register unit according to the present disclosure repeats the operations in the above-mentioned time phases t1 to t4.

Figure 7:
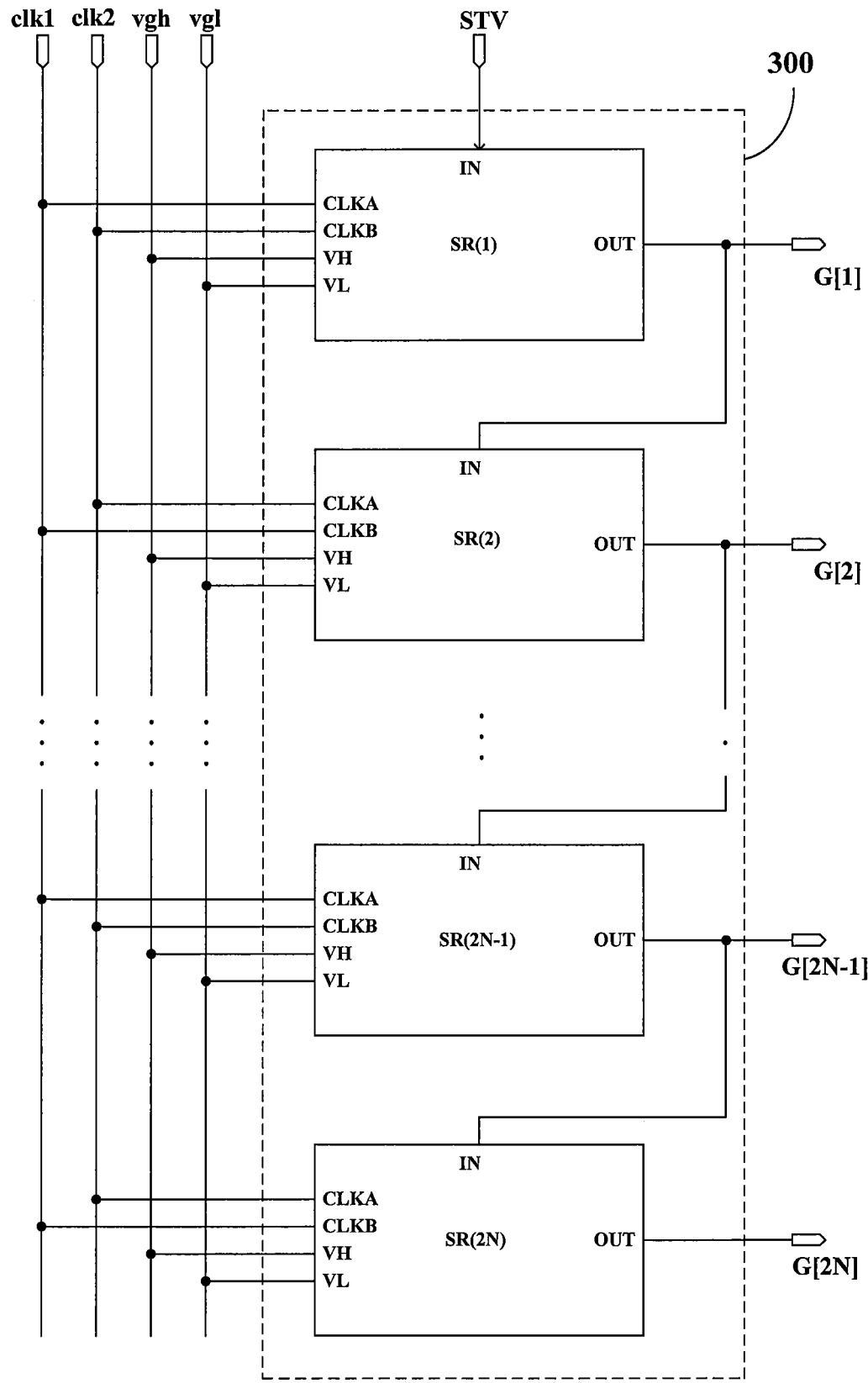
FIG. 7 shows a structural schematic view of a gate driver composed of the shift register unit as shown in FIGS. 1-5, and the connection of the gate driver in the display panel.

FIG. 7 shows a structural schematic view of a gate driver 300 composed of the shift register unit as shown in FIGS. 1-5, and also the exemplary connection of the gate driver 300 in an exemplary display panel.

As shown in FIG. 7, the gate driver 300 comprises 2N cascaded shift register units SR(1), SR(2), . . . , SR(2N−1) and SR(2N), each of which may adopt one of the forms of the shift register units described with reference to FIGS. 1 to 5 hereinbefore. N may be an integer greater than or equal to 1. In the gate driver 300, except the first shift register unit SR(1), the input terminal IN of each of the shift register units is connected to the output terminal OUT of the adjacent previous shift register unit.

When the gate driver 300 is arranged in the display panel, the 2N shift register units SR(1), SR(2), SR(2N−1) and SR(2N) in the gate driver 300 may be correspondingly connected to 2N gate lines G[1], G[2], . . . , G[2N−1] and G[2N]. In addition, for each of the shift register units SR(1), SR(2), SR(2N−1) and SR(2N), the first voltage terminal VH is connected to the first voltage line vgh, the second voltage terminal is connected to the second voltage line vgl, wherein the first voltage line vgh is configured to transmit the first voltage line voltage, and the second voltage line vgl is configured to transmit the second voltage line voltage. In addition, the first clock terminal CLKA of each of the odd-numbered shift register units in the shift register units SR(1), SR(2), SR(2N−1) and SR(2N) is connected to the first clock line clk1, and the second clock terminal CLKB thereof is connected to the second clock line clk2; and the first clock terminal CLKA of each of the even-numbered shift register units is connected to the second clock line clk2, and the second clock terminal CLKB thereof is connected to the first clock line clk1.

Figure 8:
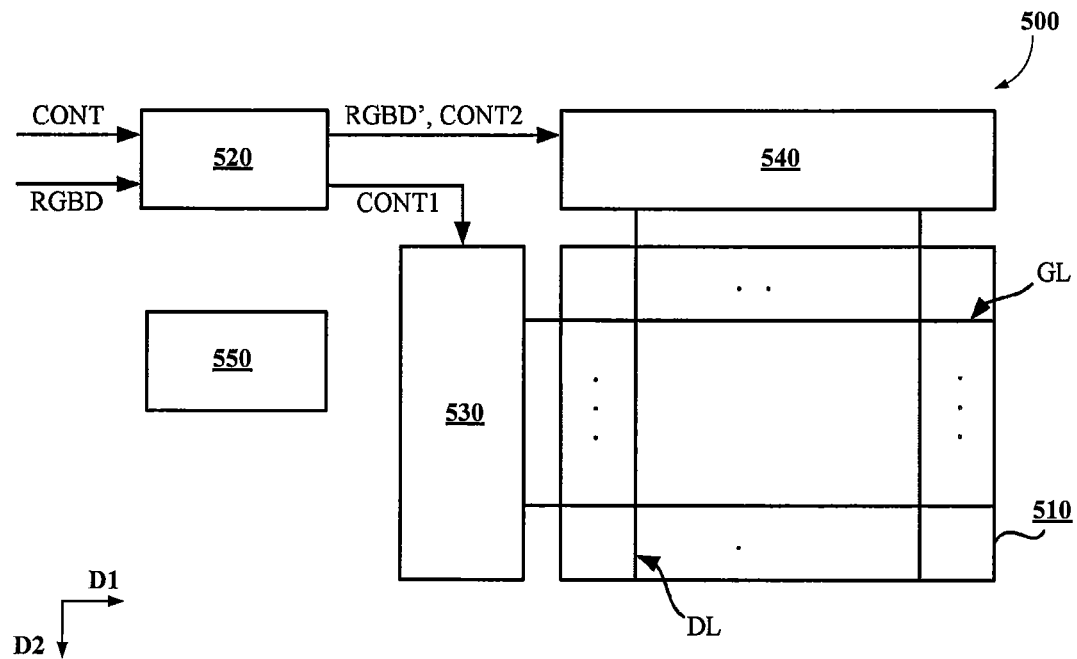
FIG. 8 is a structural schematic view of a display device according to an exemplary embodiment of the present disclosure.

FIG. 8 is a structural schematic view of a display device 500 according to an exemplary embodiment of the present disclosure. With reference to FIG. 8, the display device 500 comprises a display panel 510, a timing controller 520, a gate driver 530, a data driver 540, and a voltage generator 550. The gate driver 530 may take the form of the gate driver 300 shown with respect to FIG. 7. In addition, the first clock line clk1, the second clock line clk2, the first voltage line vgh, and the second voltage line vgl shown in FIG. 7 are omitted in FIG. 8 for easy illustration.

The display panel 510 is used to display received image data. The display panel 510 may have various types of structures, such as add-on, in-cell, on-cell, OGS, etc. The display panel 510 comprises a plurality of gate lines GL extending in a first direction D1 and a plurality of data lines DL extending in a second direction D2 intersecting (e.g., substantially perpendicular to) the first direction D1. The display panel 510 comprises a plurality of pixels (not shown) arranged in an array form. Each of the pixels may be electrically connected to a corresponding one of the gate lines GL and a corresponding one of the data lines DL. The display panel 510 may be a liquid crystal display panel, an organic light-emitting diode (OLED) display panel, or any other suitable type of display panel.

The timing controller 520 controls the operations of the display panel 510, the gate driver 530, the data driver 540, and the voltage generator 550. The timing controller 520 receives input image data RGBD and an input control signal CONT from an external device (e.g., a host). The input image data RGBD may comprise a plurality of input pixel data for a plurality of pixels. Each input pixel datum may comprise a red grayscale datum R, a green grayscale datum G, and a blue grayscale datum B for a corresponding one of the plurality of pixels. The input control signal CONT may comprise a main clock signal, a data enable signal, a vertical synchronization signal, a horizontal synchronization signal, and the like. The timing controller 520 generates output image data RGBD', a first control signal CONT1, and a second control signal CONT2 based on the input image data RGBD and the input control signal CONT. Implementations of the timing controller 520 are known in the art. The timing controller 520 may be implemented in many ways (e.g., by dedicated hardware and the like) so as to perform the various functions discussed herein. A "processor" is an example of the timing controller 520 employing one or more microprocessors that may be programmed by means of software (e.g., microcode) so as to perform the various functions discussed herein. The timing controller 520 may be implemented with or without a processor, and may also be implemented as a combination of dedicated hardware that performs some functions and a processor that performs other functions. Examples of the timing controller 520 include, but are not limited to, a conventional microprocessor, an application specific integrated circuit (ASIC), and a field programmable gate array (FPGA).

The gate driver 530 receives the first control signal CONT1 from the timing controller 520. The first control signal CONT1 may comprise first and second clock line clock signals transmitted via the first and second clock lines clk1 and clk2 shown in FIG. 7. The gate driver 530 generates a plurality of gate drive signals to be outputted to the gate lines GL on the basis of the first control signal CONT1. The gate driver 530 may sequentially apply the plurality of gate drive signals to the gate lines GL.

The data driver 540 receives the second control signal CONT2 and the output image data RGBD' from the timing controller 520. The data driver 540 generates a plurality of data voltages based on the second control signal CONT2 and the output image data RGBD'. The data driver 540 may apply the plurality of generated data voltages to the data lines DL.

The voltage generator 550 supplies power to the display panel 510, the timing controller 520, the gate driver 530, the data driver 540, and potentially additional components. Specifically, the voltage generator 550 is configured to supply a first voltage line voltage and a second voltage line voltage respectively transmitted via the first voltage line vgh and the second voltage line vgl as shown in FIG. 7 under the control of the timing controller 520. The configuration of the voltage generator 550 may be known in the art. In one implementation, the voltage generator 550 may comprise a voltage converter such as a DC/DC converter and a crossbar switch. The voltage converter generates a plurality of output voltages having different voltage levels from an input voltage. Then, the crossbar switch may selectively couple these output voltages to the first voltage line vgh and the second voltage line vgl under the control of the timing controller 520, so as to supply the required first and second voltages.

In various embodiments, the gate driver 530 and/or the data driver 540 may be disposed on the display panel 510 or may be connected to the touch control display panel 510 by means of, e.g., a tape carrier package (TCP). For instance, the gate driver 530 may be integrated into the display panel 510 as a gate driver on array (GOA) circuit.

Examples of the display device 500 include, but are not limited to, a mobile phone, a tablet computer, a television, a display, a laptop computer, a digital photo frame, a navigator.

Figure 9:
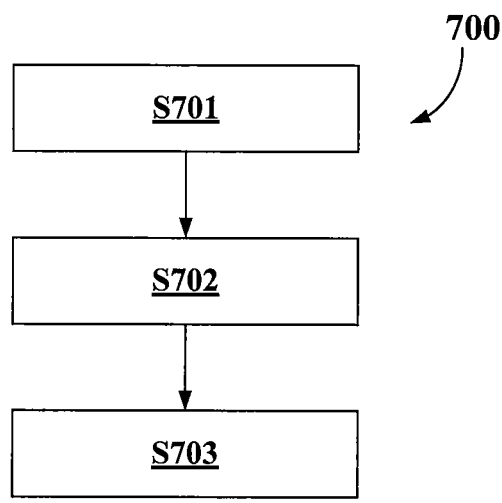
FIG. 9 shows a flowchart of an exemplary method for driving a shift register unit according to an exemplary embodiment of the present disclosure.

With reference to FIG. 9, it shows an exemplary method 700 for driving a shift register unit according to an exemplary embodiment of the present disclosure. It should be noted that the steps in the methods described below are exemplary, and they do not necessarily have to be performed in the listed order, but one or more of these steps may be performed in a different order or simultaneously according to actual situations. Furthermore, according to the actual situations, other additional steps may also be included.

The method 700 comprises the steps of:

Step S701: providing the first voltage to the first voltage terminal VH, and providing the second voltage to the second voltage terminal VL, wherein the first voltage is at an inactive potential and the second voltage is at an active potential;

Step S702: providing the first clock signal to the first clock terminal CLKA, and providing the second clock signal to the second clock terminal CLKB, wherein the first clock signal and the second clock signal have the same period and duty cycle, and are different from each other in time sequence by half a period; and Step 703: providing the input pulse to the input terminal IN, the pulse width of the input pulse being synchronized with the duration when the first clock signal received from the first clock terminal CLKA is active.

Optionally, the first clock signal received from the first clock terminal CLKA and the second clock signal received from the second clock terminal CLKB each have a duty cycle of 50%.

It shall be noted that the flowchart and block diagrams in the figures illustrate the architectures, functionalities, and operations of possible implementations of systems, methods and computer program products according to various embodiments of the present disclosure. In this regard, each block in the flowchart or block diagrams may represent a module, a program segment, or a portion of code, which comprises one or more executable instructions for implementing the specified logical function(s). It should also be noted that, in some alternative implementations, the functions noted in the block may occur in different orders from that noted in the figures. For example, two blocks shown in succession may, in fact, be executed substantially in parallel, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or operations, or by combinations of special purpose hardware and computer instructions.

The above description is merely an explanation of exemplary embodiments of the present disclosure and applied technical principles. One skilled in the art should understand that the scope of the present disclosure is not limited to the technical solutions formed by the specific combination of the above technical features, but should also cover other technical solutions formed by any combination of the above technical features or their equivalent features without departing from the inventive concept, for example, the technical solution formed by interchanging the above features with the similarly functioning technical features disclosed in (but not limited to) the present application.

What is claimed is:

1. A shift register unit, comprising:
   an input terminal configured to receive an input pulse;
   a first voltage terminal configured to receive a first voltage;
   a second voltage terminal configured to receive a second voltage;
   a first clock terminal configured to receive a first clock signal;
   a second clock terminal configured to receive a second clock signal;
   an output terminal configured to output an output signal;
   an input circuit configured to, in response to the first clock signal received at the first clock terminal being active, bring the second voltage terminal into conduction with a first node, and bring the input terminal into conduction with a second node;
   a control circuit configured to, in response to the second clock signal received at the second clock terminal being active and a potential of the second node being at active potential, change a potential of the first node to inactive potential; and
   an output circuit configured to, in response to the potential of the first node being at active potential, bring the first voltage terminal into conduction with the output terminal, and in response to the potential of the second node being at active potential, bring the second clock terminal into conduction with the output terminal.

2. The shift register unit according to claim 1, wherein the input circuit comprises:
   a first transistor comprising a control electrode connected to the first clock terminal, a first electrode connected to the first node, and a second electrode connected to the second voltage terminal; and
   a second transistor comprising a control electrode connected to the first clock terminal, a first electrode connected to the input terminal, and a second electrode connected to the second node.

3. The shift register unit according to claim 1, wherein the output circuit comprises:
   a third transistor comprising a control electrode connected to the first node, a first electrode connected to the output terminal, and a second electrode connected to the first voltage terminal; and
   a fourth transistor comprising a control electrode connected to the second node, a first electrode connected to the second clock terminal, and a second electrode connected to the output terminal.

4. The shift register unit according to claim 3, wherein the output circuit further comprises:
   a first capacitor comprising a first electrode connected to the second electrode of the fourth transistor, and a second electrode connected to the control electrode of the fourth transistor.

5. The shift register unit according to claim 3, wherein the output circuit further comprises:
   a second capacitor comprising a first electrode connected to the second electrode of the third transistor, and a second electrode connected to the control electrode of the third transistor.

6. The shift register unit according to claim 4, wherein the output circuit further comprises a second capacitor comprising a first electrode connected to the second electrode of the third transistor, and a second electrode connected to the control electrode of the third transistor.

7. The shift register unit according to claim 2,
   wherein, the output circuit comprises:
      a third transistor comprising a control electrode connected to the first node, a first electrode connected to the output terminal, and a second electrode connected to the first voltage terminal; and
      a fourth transistor comprising a control electrode connected to the second node, a first electrode connected to the second clock terminal, and a second electrode connected to the output terminal,
   wherein the control circuit comprises:
      a fifth transistor comprising a control electrode connected to the second clock terminal, and a first electrode connected to the first node; and
      a sixth transistor comprising a control electrode connected to the second node, and a second electrode connected to the first voltage terminal,
   wherein the second electrode of the fifth transistor is connected to the first electrode of the sixth transistor;
      a first capacitor comprising a first electrode connected to the second electrode of the fourth transistor, and a second electrode connected to the control electrode of the fourth transistor; and
      a second capacitor comprising a first electrode connected to the second electrode of the third transistor, and a second electrode connected to the control electrode of the third transistor.

8. The shift register unit according to claim 7, wherein the control circuit further comprises:
   a seventh transistor comprising a control electrode connected to the first node, and a second electrode connected to the first voltage terminal; and
   an eighth transistor comprising a control electrode connected to the second clock terminal, and a first electrode connected to the second node,
   wherein the first electrode of the seventh transistor is connected to the second electrode of the eighth transistor.

9. The shift register unit according to claim 2,
   wherein, the output circuit comprises:
      a third transistor comprising a control electrode connected to the first node, a first electrode connected to the output terminal, and a second electrode connected to the first voltage terminal; and
      a fourth transistor comprising a control electrode connected to the second node, a first electrode connected to the second clock terminal, and a second electrode connected to the output terminal, wherein the control circuit comprises:
  a fifth transistor comprising a control electrode connected to the second clock terminal, and a first electrode connected to the first node; and
  a sixth transistor comprising a control electrode connected to the second node, and a second electrode connected to the first clock terminal,
  wherein the second electrode of the fifth transistor is connected to the first electrode of the sixth transistor;
  a first capacitor comprising a first electrode connected to the second electrode of the fourth transistor, and a second electrode connected to the control electrode of the fourth transistor; and
  a second capacitor comprising a first electrode connected to the second electrode of the third transistor, and a second electrode connected to the control electrode of the third transistor.

10. The shift register unit according to claim 9, wherein the control circuit further comprises:
  a seventh transistor comprising a control electrode connected to the first node, and a second electrode connected to the first voltage terminal; and
  an eighth transistor comprising a control electrode connected to the second clock terminal, and a first electrode connected to the second node,
  wherein the first electrode of the seventh transistor is connected to the second electrode of the eighth transistor.

11. The shift register unit according to claim 1, wherein the control circuit comprises:
  a fifth transistor comprising a control electrode connected to the second clock terminal, and a first electrode connected to the first node; and
  a sixth transistor comprising a control electrode connected to the second node, and a second electrode connected to the first voltage terminal,
  wherein the second electrode of the fifth transistor is connected to the first electrode of the sixth transistor.

12. The shift register unit according to claim 11, wherein the control circuit further comprises:
  a seventh transistor comprising a control electrode connected to the first node, and a second electrode connected to the first voltage terminal; and
  an eighth transistor comprising a control electrode connected to the second clock terminal, and a first electrode connected to the second node,
  wherein the first electrode of the seventh transistor is connected to the second electrode of the eighth transistor.

13. The shift register unit according to claim 1, wherein the control circuit comprises:
  a fifth transistor comprising a control electrode connected to the second clock terminal, and a first electrode connected to the first node; and
  a sixth transistor comprising a control electrode connected to the second node, and a second electrode connected to the first clock terminal,
  wherein the second electrode of the fifth transistor is connected to the first electrode of the sixth transistor.

14. The shift register unit according to claim 13, wherein the control circuit further comprises:
  a seventh transistor comprising a control electrode connected to the first node, and a second electrode connected to the first voltage terminal; and
  an eighth transistor comprising a control electrode connected to the second clock terminal, and a first electrode connected to the second node,
  wherein the first electrode of the seventh transistor is connected to the second electrode of the eighth transistor.

15. A gate driver comprising N cascaded shift register units according to claim 1,
  wherein N is an integer greater than or equal to 2,
  wherein an output terminal of an m-th shift register unit of the N shift register units is connected to an input terminal of the (m+1)-th shift register unit of the N shift register units, and
  wherein m is an integer and $1 \leq m < N$.

16. A display panel comprising:
  a first voltage line configured to transmit a first voltage line voltage;
  a second voltage line configured to transmit a second voltage line voltage;
  a first clock line configured to transmit a first clock line clock signal;
  a second clock line configured to transmit a second clock line clock signal; and
  the gate driver according to claim 15,
  wherein the first voltage terminal of each of the N shift register units is connected to the first voltage line,
  wherein the second voltage terminal of each of the N shift register units is connected to the second voltage line,
  wherein the first clock terminal of a (2k−1)-th shift register unit of the N shift register units is connected to the first clock line,
  wherein the second clock terminal of the (2k−1)-th shift register unit is connected to the second clock line,
  wherein the first clock terminal of the 2k-th shift register unit of the N shift register units is connected to the second clock line,
  wherein the second clock terminal thereof is connected to the first clock line, and
  wherein k is a positive integer and $2k \leq N$.

17. A display device comprising:
  the display panel according to claim 16;
  a timing controller configured to control operation of the display panel, wherein the timing controller is configured to provide the first clock line and the second clock line respectively with the first clock line clock signal and the second clock line clock signal, wherein the first clock line clock signal and the second clock line clock signal have a same period and a same duty cycle, and are different from each other in time sequence by a half period; and
  a voltage generator configured to at least provide the first voltage line and the second voltage line respectively with the first voltage line voltage and the second voltage line voltage,
  wherein the first voltage line voltage is at inactive voltage level and the second voltage line voltage is at inactive voltage level.

18. The display device according to claim 17, wherein the first clock line clock signal and the second clock line clock signal each have a 50% duty cycle.

19. A method for driving the shift register unit according to claim 1, the method comprising:
  providing the first voltage to the first voltage terminal, and providing the second voltage to the second voltage terminal, wherein the first voltage is at an inactive voltage level and the second voltage is at an inactive voltage level;

providing the first clock signal to the first clock terminal, and providing the second clock signal to the second clock terminal, wherein the first clock signal and the second clock signal have a same period and duty cycle, and are different from each other in time sequence by a half period; and providing the input pulse to the input terminal, wherein a pulse width of the input pulse is synchronized with a duration when the first clock signal is inactive.

20. The method according to claim 19, wherein the first clock signal and the second clock signal each have a duty cycle of 50%.

* * * * *